US012597917B2

(12) United States Patent
Shapiro et al.

(10) Patent No.: US 12,597,917 B2
(45) Date of Patent: Apr. 7, 2026

(54) POWER SWITCH WITH NORMALLY ON TRANSISTOR

(71) Applicant: VISIC TECHNOLOGIES LTD., Ness Ziona (IL)

(72) Inventors: David Shapiro, Rishion LeZion (IL); Shmuel Ben-Yaacov, Tel Yitzhak (IL); Dmitry Novo, Kibbutz Beit-Govrin (IL); Gleb Vetakh, Ashdod (IL); Shahar Wagner, Ein-Vered (IL)

(73) Assignee: VISIC TECHNOLOGIES LTD, Nes Ziona (IL)

( * ) Notice: Subject to any disclaimer, the term of this patent is extended or adjusted under 35 U.S.C. 154(b) by 26 days.

(21) Appl. No.: 18/882,850

(22) Filed: Sep. 12, 2024

(65) Prior Publication Data

US 2025/0007506 A1     Jan. 2, 2025

Related U.S. Application Data

(63) Continuation-in-part of application No. 18/703,343, filed as application No. PCT/IL2021/051284 on Oct. 29, 2021, now Pat. No. 12,149,233.

(51) Int. Cl.
  H03K 17/06      (2006.01)
  H03K 17/16      (2006.01)
(52) U.S. Cl.
  CPC ......... H03K 17/063 (2013.01); H03K 17/162 (2013.01); H03K 2217/0081 (2013.01)
(58) Field of Classification Search
  CPC ............... H03K 17/063; H03K 17/162; H03K 2217/0081; H03K 2017/6875

(Continued)

(56) References Cited

U.S. PATENT DOCUMENTS 9,479,159 B2 * 10/2016 Zojer ..................... H02M 1/088
9,559,683 B2 * 1/2017 Zojer ..................... H02M 1/088
(Continued)

FOREIGN PATENT DOCUMENTS

EP          3304738          4/2018
KR     1020140023611      2/2014
(Continued)

OTHER PUBLICATIONS

Decision to Grant dated Aug. 4, 2025 for Korean Application No. 10-2024-7015263 filed May 7, 2024.
(Continued)

*Primary Examiner* — Ryan Jager
(74) *Attorney, Agent, or Firm* — A.C. Entis-IP; Allan C. Entis

(57)          ABSTRACT
A power switch comprising: a cascode having a normally ON transistor connected in series with a normally OFF transistor at a cascode node; a safety switch between a gate of the normally ON transistor and a first ground common to the cascode and the switch; and a controller comprising: a controller power supply having a power supply output connected to the cascode node at which output the controller power supply provides a voltage relative to a second ground that is floating relative to the first ground; a first controller output connected to the gate of the normally ON transistor at which the controller generates a first voltage relative to the second ground; wherein the controller power supply is connected to the safety switch and voltage provided by the controller power supply is coupled to and operates to maintain the safety switch OFF and nonconducting and in the absence of the voltage the safety switch is turned ON and conducting.

13 Claims, 8 Drawing Sheets

(58) Field of Classification Search

USPC ........................................................ 327/427

See application file for complete search history.

(56)       References Cited

U.S. PATENT DOCUMENTS

| | | | | |
|---|---|---|---|---|
| 9,793,260 | B2 * | 10/2017 | Zojer ................. | H02M 1/4233 |
| 10,298,227 | B2 * | 5/2019 | Bunin ................. | H03K 17/102 |
| 10,715,131 | B2 * | 7/2020 | Bunin .................... | H03K 17/74 |
| 10,826,485 | B2 * | 11/2020 | Randolph ............ | H03K 17/063 |
| 11,088,534 | B2 * | 8/2021 | Bahl ..................... | H02H 7/1213 |
| 11,101,791 | B2 * | 8/2021 | Guillot ................. | H03K 17/162 |
| 11,264,899 | B2 * | 3/2022 | Yoshioka ........... | H03K 17/6871 |
| 2015/0171750 | A1 * | 6/2015 | Zeng ..................... | H10D 84/01 |
| | | | | 323/311 |
| 2016/0065064 | A1 | 3/2016 | Zojer | |
| 2025/0007506 | A1 * | 1/2025 | Shapiro ............... | H03K 17/063 |
| 2025/0317138 | A1 * | 10/2025 | Zhu .................... | H03K 17/0822 |

FOREIGN PATENT DOCUMENTS

| | | |
|---|---|---|
| WO | 2013011289 | 1/2013 |
| WO | 2016189371 | 12/2016 |
| WO | 2018096535 | 5/2018 |

OTHER PUBLICATIONS

Wei Zhang, Gate Drive Design Considerations for High Voltage Cascode GaN HEMT, Mar. 16, 2014 IEEE, pp. 1484-1489.

International Preliminary Report on Patentability dated Feb. 12, 2024 for PCT International Application No. PCT/IL2021/051284 filed Oct. 29, 2021.

International Search Report and Written Opinion dated Jul. 11, 2022 PCT International Application No. PCT/IL2021/051284 filed Oct. 29, 2021.

* cited by examiner

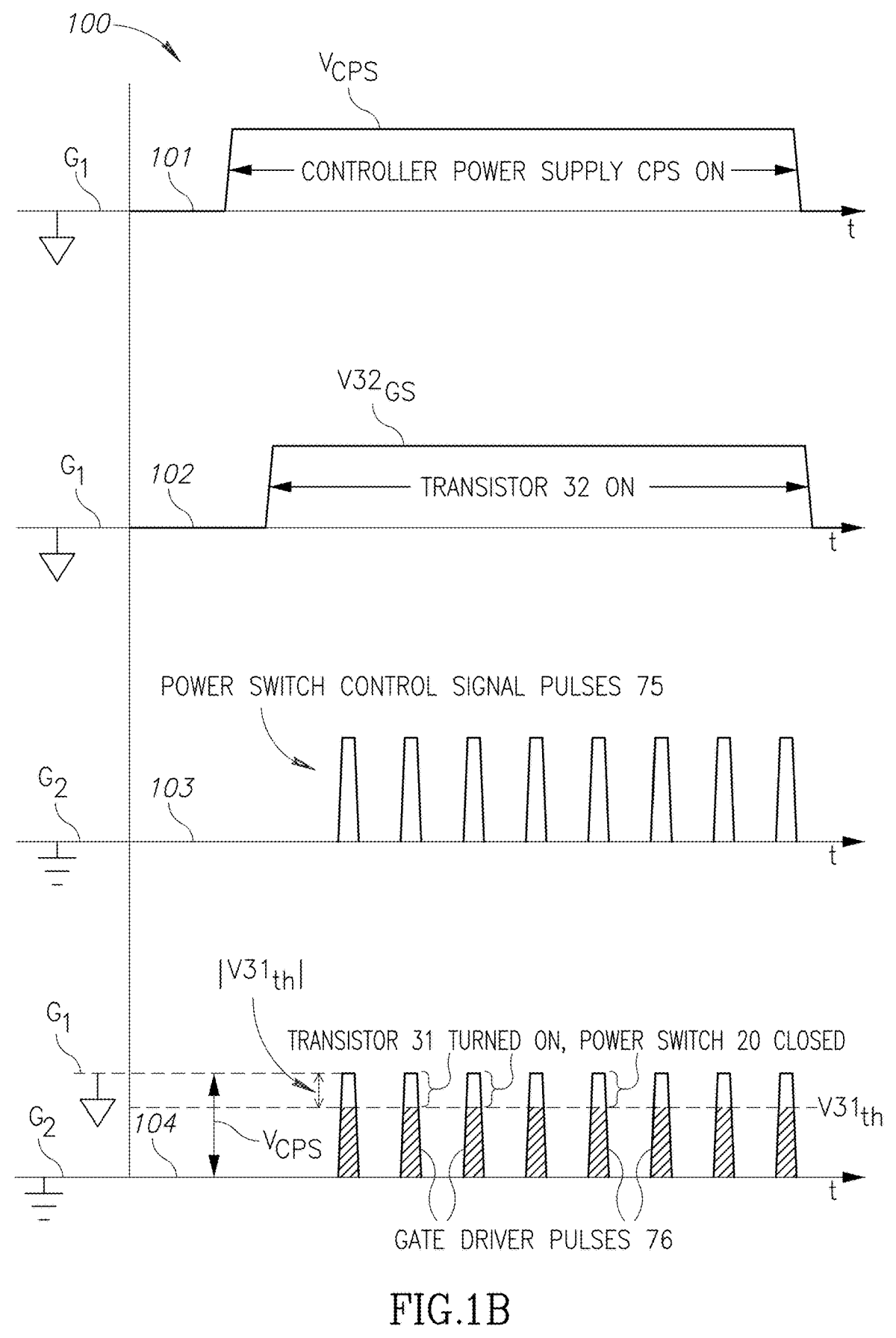

100

$V_{CPS}$ $G_1$   101

CONTROLLER POWER SUPPLY CPS ON t $V32_{GS}$ $G_1$   102

TRANSISTOR 32 ON t

POWER SWITCH CONTROL SIGNAL PULSES 75

$G_2$   103 t $|V31_{th}|$ $G_1$

TRANSISTOR 31 TURNED ON, POWER SWITCH 20 CLOSED $G_2$   104

$V31_{th}$ $V_{CPS}$ t

GATE DRIVER PULSES 76

FIG.1B

POWER SWITCH WITH NORMALLY ON TRANSISTOR

RELATED APPLICATIONS

The present application is a continuation in part application of U.S. patent application Ser. No. 18/703,343 filed on Apr. 21, 2024, which is a national phase of PCT/IL2021/051284 filed on Oct. 29, 2021, the disclosures of which are incorporated herein in their entirety, by reference.

FIELD

Embodiments of the invention relate to a power switch comprising a normally ON, generally a depletion mode transistor controlled to switch OFF and ON to provide pulses of electrical power to a load.

BACKGROUND

Modern optical and electronic devices of almost all types, from computers to powertrains, comprise power switching circuitry for generating timing pulses, data packets, and/or delivering power. For delivering power to electric powertrains, such as powertrains used to deliver power to electric vehicles, power switches are required that can be rapidly turned ON and OFF to couple and decouple a high voltage electric power source to a load. Group III-V high electron mobility transistors (HEMTs), for example GaN (gallium nitride) transistors, are particularly advantageous for such applications. Group III-V HEMTs are wide band gap transistors characterized by high breakdown voltage, high current density, and low ON-state resistance. However, Group III-V HEMTs are generally normally ON, depletion mode (D-mode) transistors. As a result, in power switching circuitry that use these transistors as switching elements, a controller is required to be in constant control of the ON/OFF states of the transistors and maintain them OFF as long as they are coupled to a power source and not required to be ON to switch power from the power source to a load. In the absence of such control, for example if the switching circuitry is connected to the power source before being connected to the controller or the controller malfunctions during operation, large current transients may be generated that damage the power switch, the load, and/or the power source.

SUMMARY

An aspect of an embodiment of the disclosure relates to providing a fast-switching power switch that comprises a normally ON optionally a depletion mode (D-mode) transistor. The power switch is configured to electrically connect and disconnect a load to and from a load power source by switching the D-mode transistor between ON and OFF and prevent generation of large current transients that might damage the power switch, load, and/or power source.

In an embodiment the power switch comprises a cascode in which the normally ON transistor is connected in series with a normally OFF, optionally enhancement mode, transistor at a node of the cascode. A diode, optionally referred to as a safety diode, is connected between the gate of the normally ON transistor and a first ground common to the cascode and the diode. A controller powered by a controller power supply controls the gates of the depletion and enhancement mode transistors. An output of the controller power supply that provides a controller voltage relative to a second ground is connected to the cascode node. The second ground, which may be referred as a floating ground or ground floating relative to the first ground, is not directly connected to the first ground, and has a voltage that is offset relative to the first ground responsive to voltage of the cascode node minus the controller voltage. The controller power supply voltage has an absolute value greater than an absolute value of a threshold voltage of the normally ON transistor.

The controller dynamically controls the ON/OFF states of the transistors to turn ON and turn OFF the power switch, and to prevent large transient currents is configured to maintain the normally ON transistor OFF as long as the enhancement mode transistor is OFF. The controller controls the gates to make the cascode conducting and turn ON the power switch by first turning ON the enhancement mode transistor and then the normally ON transistor. When the power switch is turned ON, the cascode provides a conducting path through which current may flow from a load power supply connected to the power switch to provide power to a load connected to the power switch. The controller controls the gates to render the cascode non-conducting and turn OFF the power switch to prevent current from the load power supply to flow through the cascode and provide power to the load by turning OFF the normally ON transistor while the enhancement mode transistor ON.

For a situation, also referred to as an aberrant situation, in which the power switch is connected to a load power supply and the controller does not operate to maintain the normally ON transistor OFF when the enhancement mode transistor is OFF, the safety diode operates to turn OFF the normally ON transistor and protect the power switch, the load and/or the load power source from damage resulting from large transient currents.

Whereas in accordance with an embodiment of the disclosure the depletion and enhancement transistors may be n-channel or p-channel transistors, for convenience of presentation and reference to voltage polarities it is assumed by way of example in the following discussion that the depletion and enhancement mode transistors are n-channel transistors. The source of the enhancement mode transistor is assumed to be connected to the first ground and the anode of the safety diode connected to the gate of the normally ON transistor. The first ground voltage is assumed to be a zero-reference voltage and the load power supply to provide a positive voltage relative to the first ground.

For aberrant situations in which the power switch is connected to a load power supply and the controller does not operate to maintain the normally ON transistor OFF when the enhancement mode transistor is OFF, voltage of the drain and source of the normally ON transistor become relative to the first ground substantially equal to a positive voltage provided by the load power supply. The safety diode limits voltage at the normally ON transistor gate relative to the first ground to a positive forward voltage of the safety diode that is less than the positive voltage of the power supply by at least the absolute value of the threshold voltage of the normally ON transistor. The forward voltage of the safety diode generates thereby a gate to source voltage for the normally ON transistor that is less than the threshold voltage and turns OFF the normally ON transistor to prevent transient current flow from damaging the power switch, the load, and/or the power supply.

When the controller subsequently turns ON the enhancement mode transistor, the cascode node, the source of the normally ON transistor, the drain of the enhancement mode transistor and thereby the controller power supply output are electrically connected to the first ground. The voltage of the second ground therefore assumes a voltage, optionally referred to as a controller operating reference voltage, that is less than the first ground by about the controller power supply voltage. As a result, the controller sets the voltage of the gate of the normally ON transistor to the controller operating reference voltage and maintains the normally ON transistor OFF and the power switch turned OFF. The controller operates to turn ON the normally ON transistor and turn ON the power switch by applying to the normally ON transistor gate a "turn-on" positive voltage relative to the controller operating reference voltage. The turn-on voltage has a magnitude that raises the voltage of the normally ON transistor gate to greater than the voltage of the first ground minus the absolute value of the normally ON transistor threshold voltage but less than the voltage of the first ground plus the forward voltage of safety diode. The turn-on voltage therefor is not shunted to ground by the safety diode but generates a gate to source voltage for the normally ON transistor that turns ON the normally ON transistor and turns ON the power switch.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE FIGURES

Non-limiting examples of embodiments of the invention are described below with reference to figures attached hereto that are listed following this paragraph. Identical structures, elements or parts that appear in more than one figure are generally labeled with a same numeral in all the figures in which they appear. Dimensions of components and features shown in the figures are chosen for convenience and clarity of presentation and are not necessarily shown to scale.

FIG. 1B shows timelines along which voltages that the controller generates to control the power switch are schematically shown as functions of time, in accordance with an embodiment of the disclosure;

DETAILED DESCRIPTION

In the discussion, unless otherwise stated, adjectives such as "substantially" and "about" modifying a condition or relationship characteristic of a feature or features of an embodiment of the disclosure, are understood to mean that the condition or characteristic is defined to within tolerances that are acceptable for operation of the embodiment for an application for which it is intended. Wherever a general term in the disclosure is illustrated by reference to an example instance or a list of example instances, the instance or instances referred to, are by way of non-limiting example instances of the general term, and the general term is not intended to be limited to the specific example instance or instances referred to. The phrase "in an embodiment", whether or not associated with a permissive, such as "may", "optionally", or "by way of example", is used to introduce for consideration an example, but not necessarily a required configuration of possible embodiments of the disclosure. Unless otherwise indicated, the word "or" in the description and claims is considered to be the inclusive "or" rather than the exclusive or, and indicates at least one of, or any combination of more than one of items it conjoins.

Figure 1A:
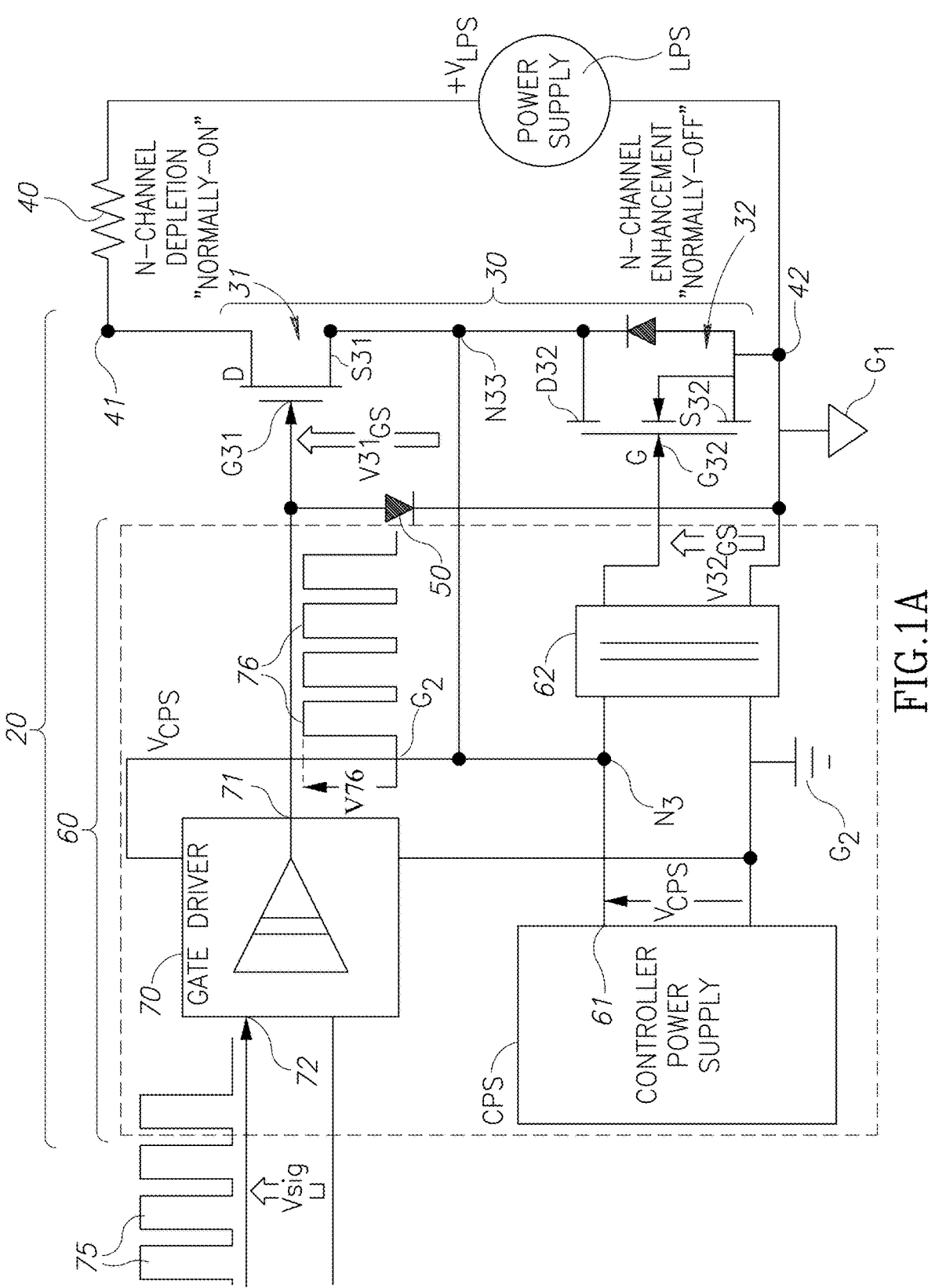
FIG. 1A shows a schematic of a power switch comprising a controller, a cascode comprising depletion and enhancement mode transistors that are controlled by the controller, and a safety diode, in accordance with an embodiment of the disclosure.

FIG. 1A schematically shows a power switch 20 in accordance with an embodiment of the disclosure. Power switch 20 comprises a cascode 30 having a normally ON optionally depletion mode, transistor 31 connected in series with a normally OFF transistor 32, a controller 60 that controls the transistors, and a safety diode 50 that operates to turn OFF the normally ON transistor in the absence of appropriate control by the controller. In an embodiment D-mode transistor 31 is optionally a GaN (Gallium Nitride) HEMT transistor and a power switch in accordance with an embodiment of the disclosure may be referred to generically, independent of particular features of the D-mode transistor, as a "Direct Drive D-Mode GaN" power switch, or simply "D³GaN".

Cascode 30 is connected between terminals 41 and 42 to which loads and load power supplies for which the D³GaN controls transmission of power from the power supplies to the loads are connected. Optionally, terminal 42 is connected to a ground $G_1$, which for convenance of presentation is assumed to have voltage equal to zero. A drain D31 of normally ON transistor 31 is connected to terminal 41 and a source S32 of enhancement mode transistor 32 is connected to terminal 42 and thereby to ground $G_1$. A drain D32 of enhancement transistor 32 is connected to a source S31 of normally ON transistor 31 at a cascode node N33. Optionally, as indicated in FIG. 1A transistors 31 and 32 are n-channel transistors, have threshold voltages $V31_{th}$ and $V32_{th}$ respectively, and normally OFF transistor 32 is an enhancement mode transistor. Safety diode 50 is connected between a gate G31 of normally ON transistor 31 and ground $G_1$ and has the anode of the safety diode connected to the gate. By way of example, in FIG. 1 a load, schematically represented by a resistor 40, and a load power supply, LPS, that provides a positive voltage $V_{LPS}$ relative to ground $G_1$ for powering the load are connected in series to D³GaN terminals 41 and 42.

Voltage signals generated by controller 60 are referenced to a ground $G_2$ that is floating relative to ground $G_1$. The controller comprises a controller power supply CPS that generates a positive voltage $V_{CPS}$ at an output 61 of the power supply relative to $G_2$ that is greater than the larger of the absolute value of the threshold voltage $V31_{th}$ and optionally the threshold voltage $V32_{th}$. Output 61 is electrically connected to cascode node N33 and to a DC isolator or isolated gate driver 62, optionally referred to generically as a DC isolator. DC isolator 62 connects controller power supply CPS to a gate G32 of enhancement transistor 32. When controller power supply CPS provides DC isolator 62 with voltage $V_{CPS}$ the DC isolator generates, or is controllable to generate, a DC voltage at gate G32 relative to ground $G_1$. The DC voltage provided by the DC isolator at gate G32 generates a gate to source voltage $V32_{GS}$ for enhancement mode transistor 32 that is greater than the threshold voltage $V32_{th}$ of the enhancement mode transistor and turns ON the enhancement mode transistor to connect cascode node N33 to ground $G_1$.

In accordance with an embodiment of the disclosure controller 60 comprises an isolated power amplifier operating as a gate driver 70 that receives power from controller power supply CPS and controls the ON/OFF state of normally ON transistor 31. The gate driver has an output 71 connected to gate G31 of the normally ON transistor 31 and an input 72 through which the gate driver receives switch control signals from a gate driver controller (not shown). When powered by voltage $V_{CPS}$ from controller power supply CPS the switch control signals control an output voltage $V_{71}$ that the gate driver generates at output 71 relative to ground $G_2$. Voltage $V_{71}$ controls voltage of gate G31 and a gate to source voltage, $V31_{GS}$, for normally ON transistor 31 that controls the ON/OFF state of the normally ON transistor 31. As discussed below, as long as controller power supply CPS provides power to DC isolator 62 to maintain enhancement mode transistor 32 turned ON, $V_{71}$ at output 71 and thereby voltage $V31_{GS}$, controls whether normally ON transistor 31 is turned OFF or turned ON and thereby whether D³GaN 20 is respectively turned OFF or turned ON.

Since output 61 of controller power supply CPS is connected to cascode node N33 and ground $G_2$ is floating relative to ground $G_1$, voltage $V_{71}$ generates a gate to source voltage $V31_{GS}=(V_{71}-V_{CPS})$ for normally ON transistor 31. In the absence of switch control signals from the gate driver, controller voltage $V_{71}$ is zero relative to $G_2$ and gate to source voltage $V31_{GS}$ is equal to $-V_{CPS}$. As a result, because $V_{CPS}$ is greater than the absolute value $|V31_{th}|$ of the threshold voltage of normally ON transistor 31, $V31_{GS}$ is less than $V31_{th}$ and operates to turn OFF and maintain the normally ON transistor OFF.

On the other hand, in accordance with an embodiment of the disclosure, when triggered by appropriate switch control signals at input 72, gate driver 70 increases voltage $V_{71}$ relative to $G_2$ to generate a gate to source voltage $V31_{GS}=(V_{71}-V_{CPS})$ that is greater than $V31_{th}$, The gate to source voltage $V31_{GS}$ therefore turns ON normally ON transistor 31 to render cascode 30 conducting and turn ON D³GaN 20.

By way of example, FIG. 1A schematically shows gate driver 70 receiving switch control signals that are a sequence of voltage pulses 75, which cause gate driver 70 to generate a corresponding sequence of output, also referred to as "turn-on", pulses 76. The voltage pulses have a positive magnitude $V_{76}$ relative to $G_2$ and generate gate to source voltage pulses $V31_{GS}=(V_{76}-V_{CPS})$. In accordance with an embodiment the magnitude of $V_{76}$ is such that $(V_{76}-V_{CPS}) \geq V31_{th}$, and each pulse 76 turns ON normally ON transistor 31 for a period substantially equal to a duration of the pulse for which $V_{76} \geq (V31_{th}+V_{CPS})$. Since enhancement mode transistor 32 is ON, switch control pulses 75 operate to turn ON and turn OFF D³GaN 20 and provide power to load 40 from load power supply LPS at a repetition frequency and duty cycle determined by the frequency and pulse widths of the switch control signal pulses.

It is noted that for D³GaN 20 voltage pulses $V_{76}$ are referenced to ground $G_2$ and have a maximum magnitude equal to $V_{CPS}$ relative to $G_2$. Relative to ground $G_1$, ground $G_2$ establishes an operating reference voltage for controller 60 that is equal to $(V_{N33}-V_{CPS})$ where $V_{N33}$ is a voltage at cascode node N33. Because enhancement transistor 32 is turned ON, cascode node N33 is electrically connected to ground $G_1$ via turned ON enhancement transistor 32. Voltage at $V_{N33}$ is therefore about equal to voltage of $G_1$ plus a voltage drop $V32_{ds}$ across enhancement transistor 32 and the operating reference voltage of ground $G_2$ is equal to about voltage $(G_1+V32_{ds})-V_{CPS}$. In an embodiment, safety diode 50 is configured to have a forward voltage $V_f$ that is greater than an expected voltage drop $V32_{ds}$ when D³GaN 20 is turned ON. Relative to ground $G_1$ to which safety diode 50 is directly connected, voltage pulses 76 therefore do not exceed the forward voltage $V_f$ of safety diode 50. As a result, the voltage pulses are not shunted to ground $G_1$ by the safety diode and prevented from generating a voltage $V31_{GS}$ that turns ON transistor 31 and switches ON D³GaN 20.

FIG. 1B shows a graph 100 that schematically shows temporal development and relative timing of voltages relevant to operation of D³GaN 20 along timelines 101, 102, 103, and 104, in accordance with an embodiment of the disclosure. Voltage $V_{CPS}$ generated by controller power supply CPS at output 61 of the controller relative to ground $G_2$ is shown along timeline 101. Timeline 102 schematically shows gate voltage $V32_{GS}$ that DC isolator 62 (FIG. 1A) applies to gate G32 to turn ON and maintain ON enhancement mode transistor 32 when controller power supply 60 provides voltage $V_{CPS}$ to the DC isolator. Timeline 103 schematically shows switch control pulses 75 that control gate driver 70 to generate gate driver output pulses 76 (FIG. 1A) which turn ON normally ON transistor 31 and switches ON D³GaN 20 when controller power supply provides voltage $V_{CPS}$. Timeline 104 schematically shows voltage of output pulses 76 and threshold voltage $V31_{th}$ of normally ON transistor 31 relative to ground $G_2$ and ground $G_1$. As described above, when controller power supply CPS is turned on and provides voltage $V_{CPS}$ to power controller 60, voltage of ground $G_2$ is less by voltage $V_{CPS}$ than voltage of ground $G_1$ to which source S31 is electrically connected by turned ON enhancement mode transistor 32. When voltage of a gate driver pulse 76 rises above $G_2$ to a voltage (assuming that $V31_{th}$ is negative) that is greater than $(G_1-|V31_{th}|)$, normally ON transistor 31 is turned ON and D³GaN 20 turned ON. Voltage at which a gate driver pulses 76 rise above $(G_1-|V31_{th}|)$ and turns ON D³GaN 20 is indicated by regions of the pulses that lack hatching.

Whereas as long as controller 60 is connected to cascode 30 and properly controls transistors 31 and 32 to maintain normally ON transistor 31 OFF and enhancement transistor 32 ON when D³GaN 20 is intended to be turned OFF, controller 60 operates as described above and prevents occurrence of potentially large and damaging transient currents. However, large damaging transient currents may develop if load power supply LPS is connected to D³GaN 20 normally ON transistor 31 is turned ON and enhancement mode transistor turned OFF, for example as a result of controller 60 malfunctioning or not being properly connected to cascode 30. In the event of such an aberrant situation, voltage of drain D31, gate G31, and source S31 of normally ON transistor 31 rise toward voltage $V_{LPS}$ of the load power supply and operate to turn ON the normally ON transistor and enable generation of damaging transient currents. In accordance with an embodiment of the disclosure safety diode 50 operates to prevent the normally ON transistor from turning ON. As voltage at gate G31 rises to exceed the forward voltage threshold $V_f$ of safety diode 50, the diode turns ON, limits voltage of gate G31 relative to ground $G_1$ to the forward diode voltage threshold and generates a negative gate to source voltage $V31_{GS}$ that turns OFF the normally ON transistor 31, and limits generation and/or persistence of large transients that might damage D³GaN 20 and circuits connected to the D³GaN.

Figure 2:
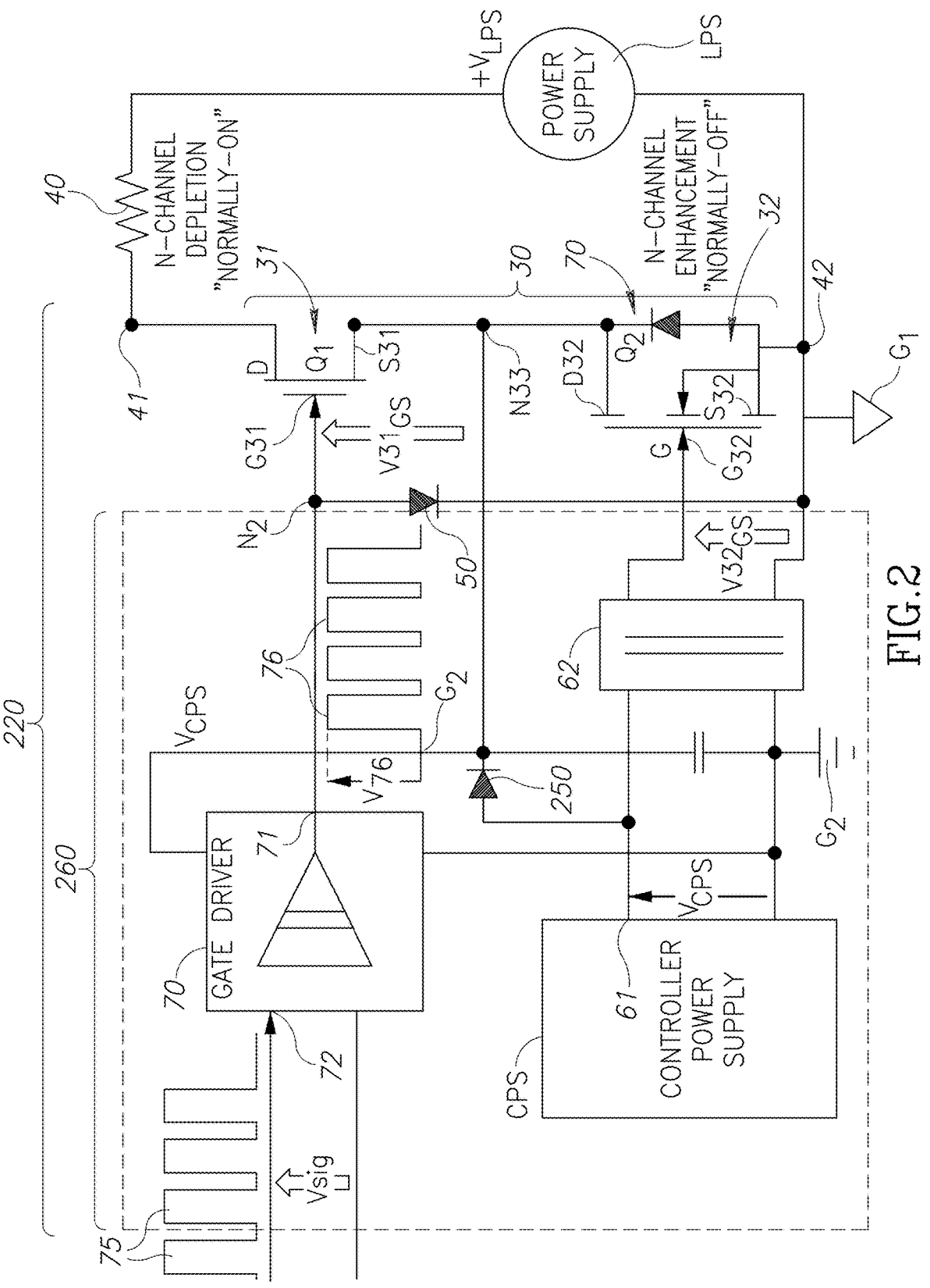
FIG. 2 schematically shows a power switch similar to that shown in FIG. 1A having an additional safety diode to protect the controller power supply from parasitic current flow, in accordance with an embodiment of the disclosure.

FIG. 2 schematically shows a D³GaN 220 in accordance with an embodiment of the disclosure. D³GaN 220 is similar to D³GaN 20 but comprises a controller 260 having an additional safety diode 250 that operates to block parasitic current path from cascode node N33 from flowing to the controller.

Figure 3A:
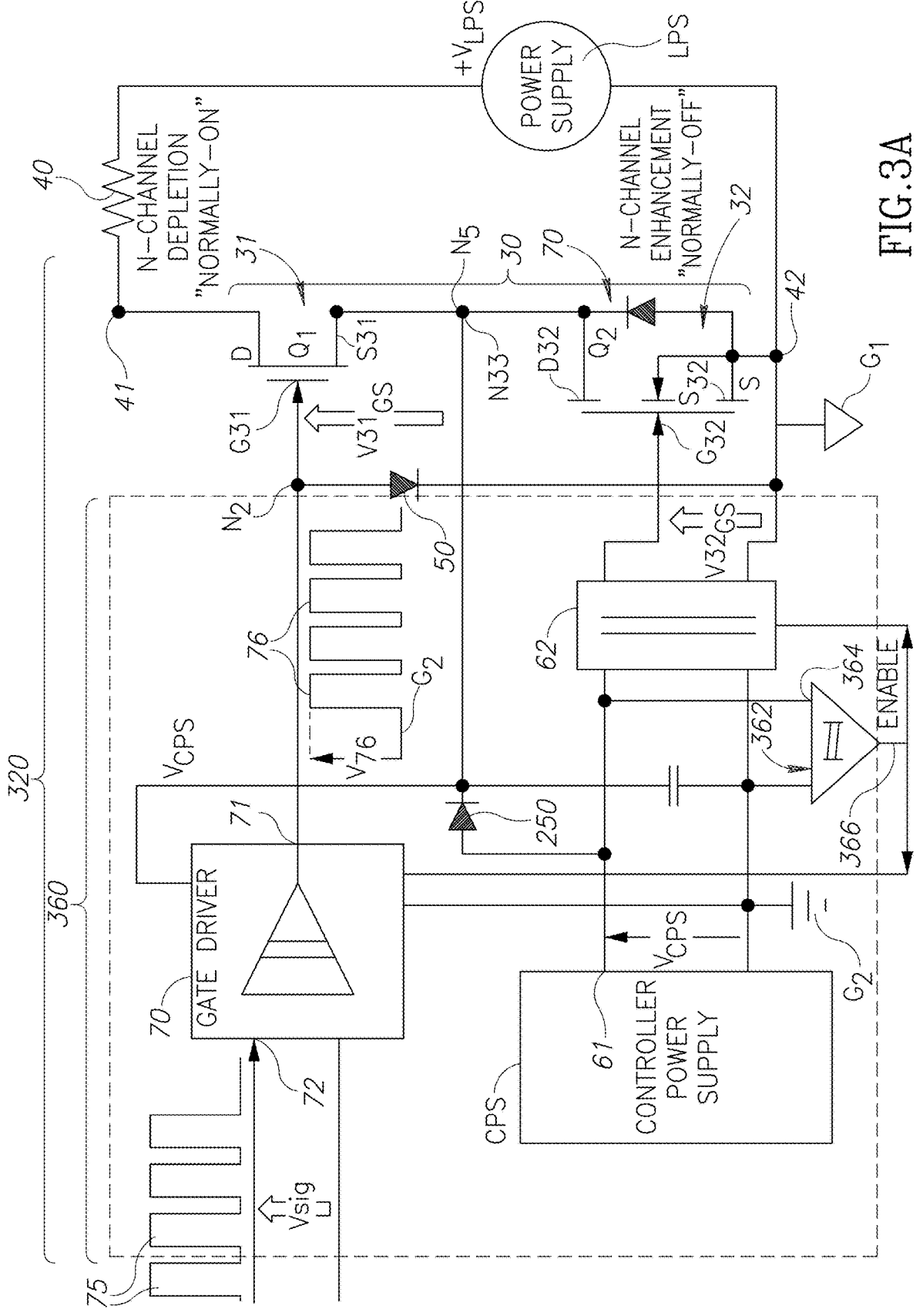
FIG. 3A schematically shows a power switch similar to that shown in FIG. 2 and comprising a comparator that disables operation of the controller when voltage from the controller power supply is insufficient to enable intended operation of the power switch, in accordance with an embodiment of the disclosure.

FIG. 3A schematically shows a D³GaN 320, in accordance with an embodiment of the disclosure. D³GaN 320 is similar to D³GaN 220 but comprises a controller 360 having a comparator 362, optionally a Schmidt trigger, having an input 364 connected to output 61 of controller power supply CPS and an output 366 connected to DC isolator 62 and gate driver 70. In accordance with an embodiment, comparator 362 disables operation of DC isolator 62 and gate driver 70 if controller power supply CPS does not provide a voltage $V_{CPS}$ that is greater than the absolute value $|V31_{th}|$ of the threshold voltage of normally ON transistor 31, or otherwise sufficient voltage to enable proper operation of the controller. If power supply CPS does provide sufficient voltage, comparator 362 generates an enable signal at output 366 that enables operation of DC isolator 62 and gate driver 70. Preventing operation of DC isolator 62 and gate driver 70 engages safety diode 50 as discussed above to turn OFF normally ON transistor 31 and turn OFF D³GaN 320.

Figure 3B:
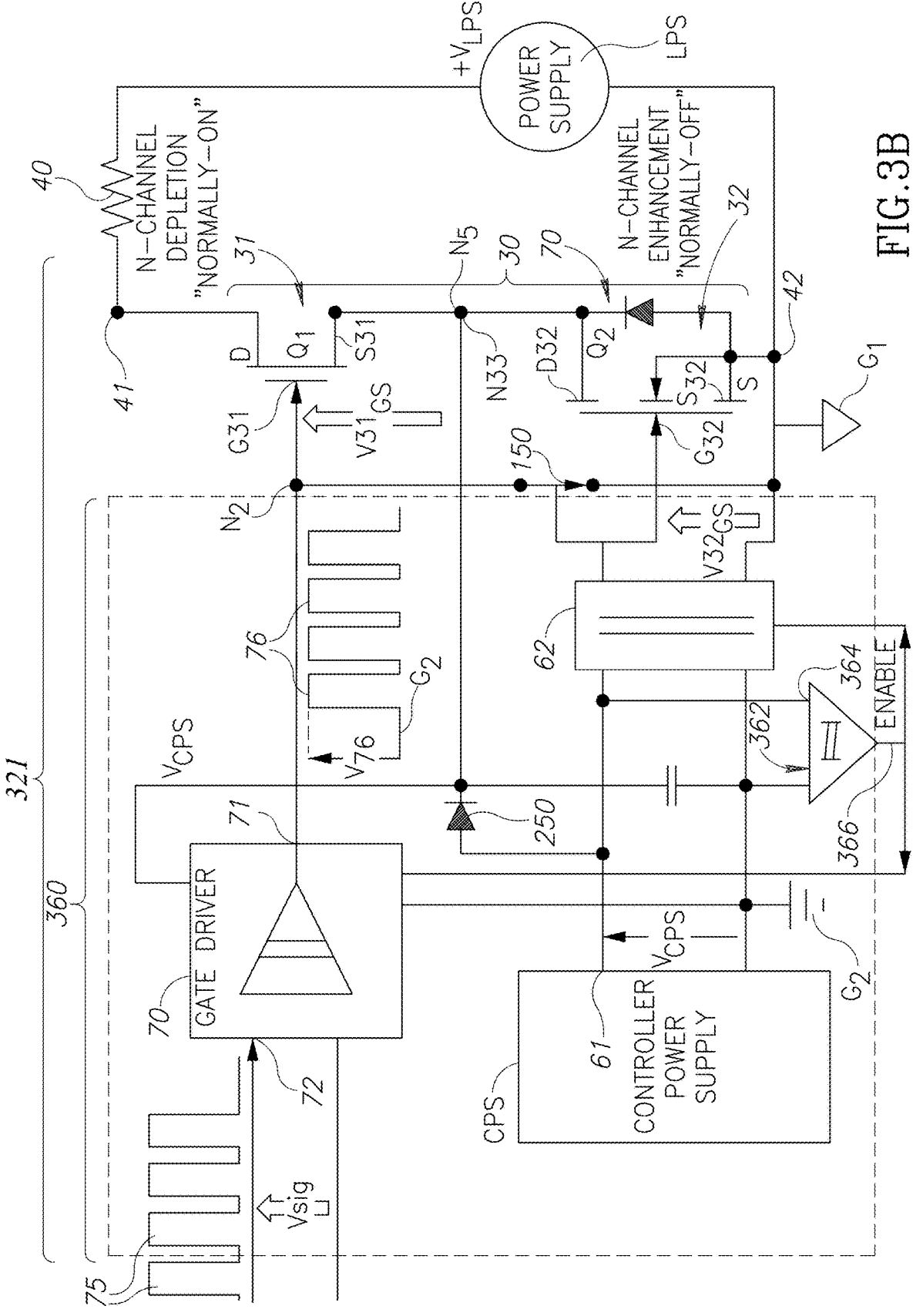
FIG. 3B schematically shows a power switch similar to that shown in FIG. 3A in which the safety diode is replaced by a normally closed switch, in accordance with an embodiment of the disclosure.

Whereas in the above description D³GaNs are described as comprising a safety diode 50 that operates to turn OFF the normally ON transistor and protect the D³GaN from damage resulting from large transient currents, practice of embodiments of the disclosure is not limited to safety diodes. For example, a normally ON switch which is turned OFF when normally OFF transistor 32 is turned ON may be used to protect the D³GaN from damaging transients. FIG. 3B schematically shows a D³GaN 321 in accordance with an embodiment that is similar to D³GaN 320 shown in FIG. 3A but having a normally ON switch 150 in place of diode 50 (FIG. 3A). Normally ON switch 150 is optionally turned OFF by an enable signal provided by comparator 362 at output 366 or by a voltage generated by gate driver 62, such as $V32_{GS}$.

Figure 4A:
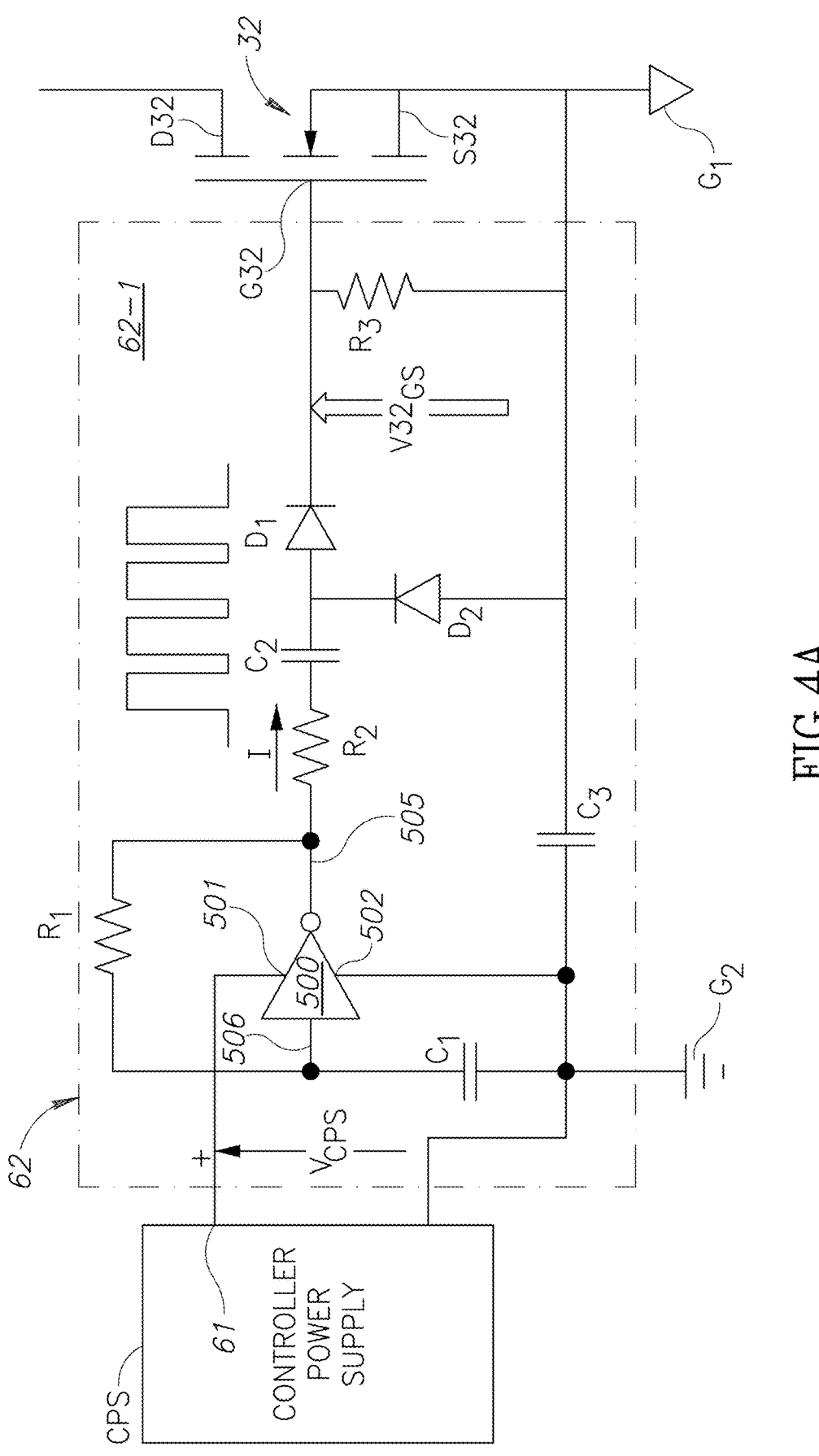
FIGS. 4A and 4B schematically show different configurations of control circuitry operable to control the normally OFF enhancement mode transistor of a power switch having a cascode, in accordance with an embodiment of the disclosure.

FIG. 4A schematically shows details of a circuit configuration 62-1 for DC isolator 62 that connects controller power supply CPS to enhancement mode transistor 32 to generate a DC gate to source voltage $V32_{GS}$ that turns ON the enhancement mode transistor, in accordance with an embodiment of the disclosure.

Circuit configuration 62-1 optionally comprises an inverting operational amplifier 500 coupled to a resistor $R_1$ and a capacitor $C_1$ connected in series to ground $G_1$. Rails 501 and 502 of amplifier 500 are connected to output 61 of controller power supply CPS and ground $G_2$ respectively. Resistor $R_1$ is connected between an output 505 and an input 506 of inverting amplifier 500. As a result, responsive to the DC voltage $V_{CPS}$ provided by controller power supply CPS, inverting amplifier 500 generates an oscillating voltage and current. The oscillating current is rectified by resistor $R_2$, capacitors $C_2$ and $C_3$, and diodes $D_1$ and $D_2$, to provide the gate to source DC voltage $V32_{GS}$ that turns ON enhancement mode transistor 32. Capacitors $C_2$ and $C_3$ DC isolate controller power supply CPS from enhancement transistor 32. Resistor $R_3$ is a bleeder resistor.

Figure 4B:
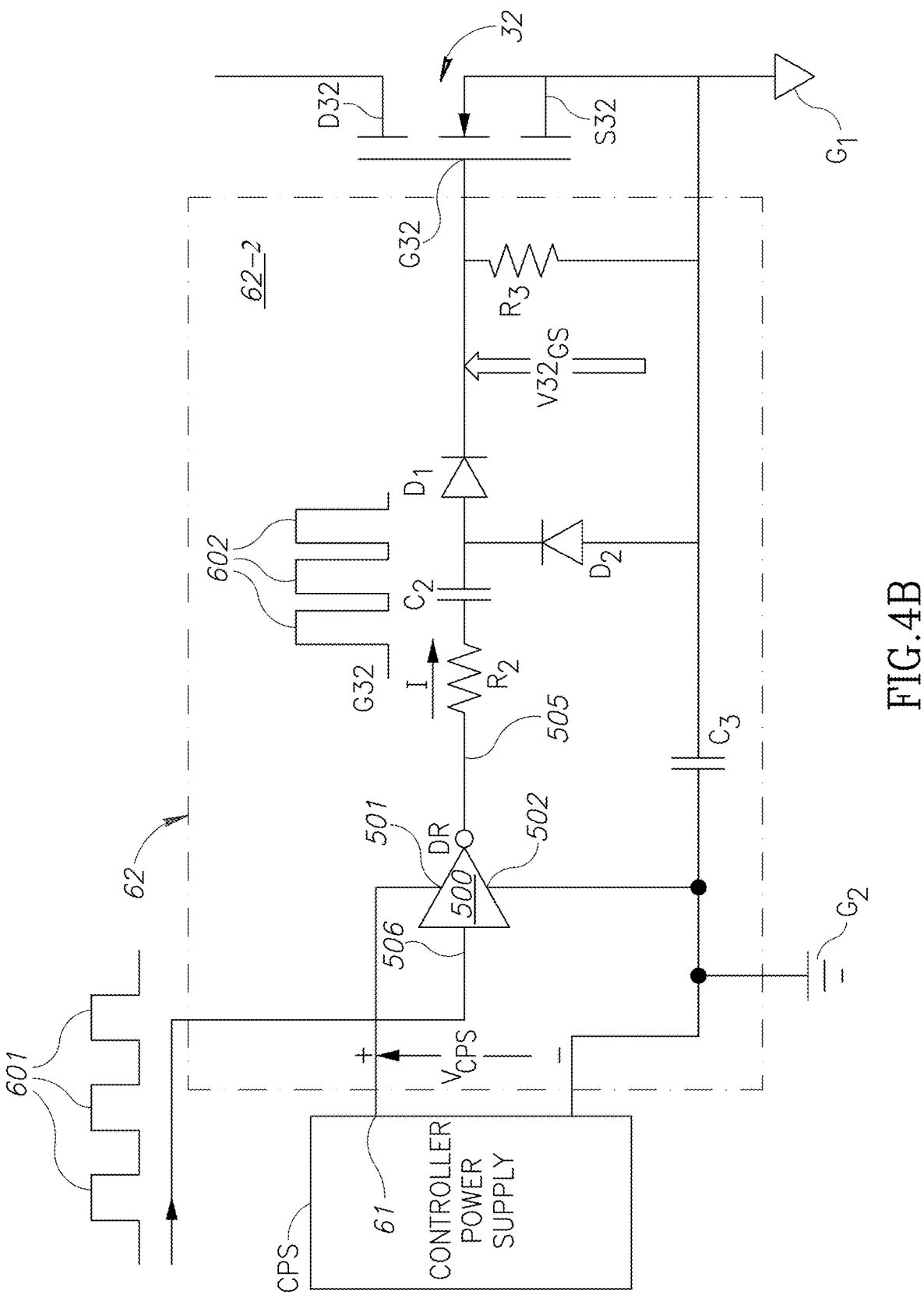

FIG. 4B schematically shows details of another circuit configuration 62-2 for DC isolator 62 that connects controller power supply CPS to enhancement mode transistor 32 to generate a DC gate to source voltage $V32_{GS}$ that turns ON the enhancement mode transistor, in accordance with an embodiment of the disclosure.

Circuit configuration 62-2 is similar to circuit configuration 62-1 but instead of generating an oscillating current by coupling output 505 of inverting operational amplifier 500 to input 506 of the amplifier, in configuration 62-2 the input is configured to receive a sequence of input pulses 601 at input 506 from an external driver (not shown), in accordance with an embodiment of the disclosure. In response to input pulses 601 amplifier 500 generates a sequence of output pulses 602 that are rectified to provide gate to source DC voltage $V32_{GS}$ that turns ON enhancement mode transistor 32.

Figure 5:
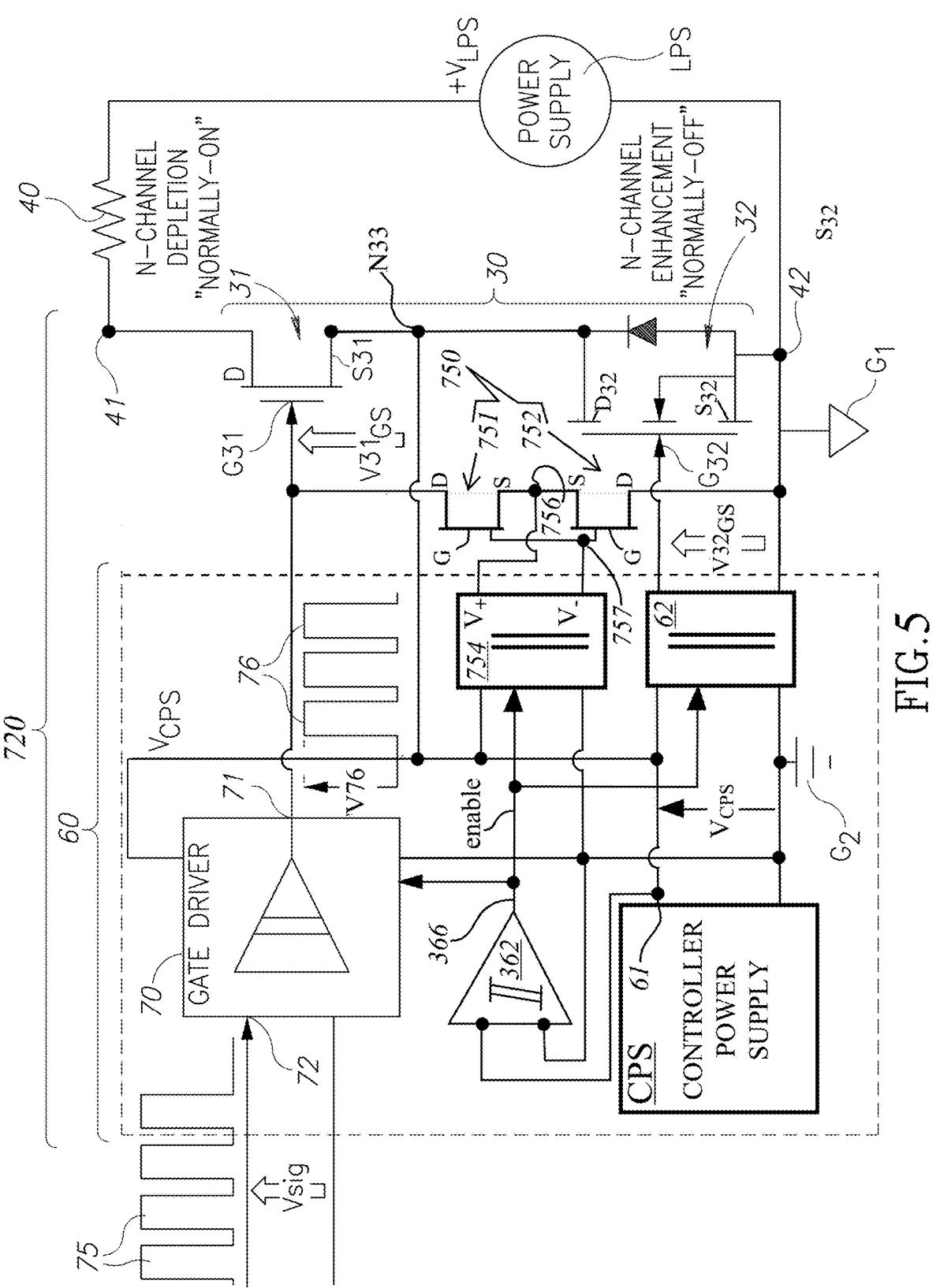
FIG. 5 schematically shows a power switch similar to that shown in FIG. 3A comprising in place of the safety diode a safety switch, in accordance with an embodiment of the disclosure.

FIG. 5 schematically shows a D³GaN 720 similar to D³GaN 320 shown in FIG. 3A comprising, in place of safety diode 50, a safety switch 750, in accordance with an embodiment of the disclosure.

Safety switch 750 comprises two, optionally n-channel, normally ON, optionally GaN HEMT (high electron mobility transistor) transistors 751 and 752 connected in series between gate G31 and ground G1. Transistors 751 and 752 have their respective sources, S, connected together at a safety switch node 756 and their gates G connected together. A DC isolator 754 receives voltage from controller power supply CPS and an enable signal from comparator 362 and has a positive output $V_+$ connected to node 756 and a negative output $V_-$ connected to gates G. As a result, when D³GaN 720 is operating to provide power to a load 40 and controller power supply CPS is turned ON and operating properly to provide power that turns ON transistor 32, gates G of transistors 751 and 752 are biased negative relative to their sources S and both transistors are turned OFF and non-conducting.

With both transistors OFF, safety switch 750 is effectively decoupled from gate G31 and does not drain current from voltage pulses 76 that gate driver 70 generates to drive gate G31 and turn ON and OFF cascode 30. Gate G31 receives substantially all the current that gate driver 70 provides in pulses 76 to turn ON transistor 31, render cascode 30 conducting, and turn ON D³GaN 720. As a result, power dissipation, referred to as switching energy, of D³GaN 720 each time a pulse 76 turns cascode 30 ON and OFF, and slew rates of current through the cascode responsive to pulses 76 are improved relative to ON/OFF switching energy and current slew rates exhibited by D³GaN 20. By way of example, a simulation comparing D³GaN 20 to D³GaN 720 was carried out, assuming that all components comprised in both D³GaN 20 and D³GaN 720 are the same except for switch 750 replacing diode 50 and that transistors 751 and 752 are D-mode GaN HEMT transistors. The simulation indicated that diode switching energy for D³GaN 720 is about 20% that of D³GaN 20, and current slew rates for D³GaN 720 are more than twice that of D³GaN 20.

On the other hand, in the event that controller power supply CPS fails to operate properly, or if power supply CPS is turned OFF, transistor 32 is turned OFF negative biasing of gates G of transistors 751 and 752 fails and transistors 751 and 752 automatically turn ON and safety switch 750 short circuits gate G31 of transistor 31 to ground G1. If cascode 30 is connected to power supply LPS voltage at node N33 rises and gate G31 becomes negatively biased and turns OFF transistor 31 to prevent damage of D³GaN 750 and load 40 from voltage and current generated by power supply LPS.

There is therefore provided in accordance with an embodiment of the disclosure, a power switch comprising: a cascode having a normally ON transistor connected in series with a normally OFF transistor at a cascode node; a safety switch between a gate of the normally ON transistor and a first ground common to the cascode and the switch; and a controller comprising: a controller power supply having a power supply output connected to the cascode node at which output the controller power supply provides a voltage relative to a second ground that is floating relative to the first ground; a first controller output connected to the gate of the normally ON transistor at which the controller generates a first voltage relative to the second ground; wherein the controller power supply is connected to the safety switch and voltage provided by the controller power supply is coupled to and operates to maintain the safety switch OFF and nonconducting and in the absence of the voltage the safety switch is turned ON and conducting. Optionally, the voltage controller power supply is coupled to the safety switch via a DC isolator. Additionally, or alternatively the safety switch comprises two normally ON safety switch transistors that have respective gates and sources and are connected together in series at a safety switch node. Optionally, the sources of the safety switch transistors are connected together at the safety switch node. Additionally, or alternatively, the gates of the safety switch transistors are connected together.

In an embodiment, the voltage provided by the power supply that operates to maintain the safety switch OFF back biases the gates of the safety switch transistors relative to the sources of the safety switch transistors to turn OFF both transistors and thereby to turn OFF the safety switch. Optionally, the voltage provided by the power supply provides a first voltage to the safety switch node and a second voltage to the gates of the safety switch transistors. Optionally, the safety switch transistors are n-channel transistors, and the first voltage biases the gates of the safety switch transistors negative relative to the sources of the safety switch transistors. Optionally, the safety switch transistors are p-channel transistors, and the first voltage biases the gates of the safety switch transistors positive relative to the sources of the safety switch transistors.

In an embodiment, the safety switch transistors are high electron mobility (HEMT) transistors. In an embodiment, the safety switch transistors are JFETs (Junction Field Effect Transistors). In an embodiment the controller comprises a second controller output connected to the gate of the normally OFF transistor at which the controller generates voltage relative to the first ground to turn ON and turn OFF the normally OFF transistor. Optionally, the controller comprises a DC isolated driver powered at its primary side by the controller power supply that generates the voltage at the second controller output.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. A power switch comprising:
   a cascode having a normally ON transistor connected in series with a normally OFF transistor at a cascode node;
   a safety switch between a gate of the normally ON transistor and a first ground common to the cascode and the switch; and
   a controller comprising:
      a controller power supply having a power supply output connected to the cascode node at which output the controller power supply provides a voltage relative to a second ground that is floating relative to the first ground;
      a first controller output connected to the gate of the normally ON transistor at which the controller generates a first voltage relative to the second ground;
      wherein the controller power supply is connected to the safety switch and voltage provided by the controller power supply is coupled to and operates to maintain the safety switch OFF and nonconducting and in the absence of the voltage the safety switch is turned ON and conducting.

2. The power switch according to claim 1 wherein the voltage controller power supply is coupled to the safety switch via a DC isolator.

3. The power switch according to claim 1 wherein the safety switch comprises two normally ON safety switch transistors that have respective gates and sources and are connected together in series at a safety switch node.

4. The power switch according to claim 3 wherein the sources of the safety switch transistors are connected together at the safety switch node.

5. The power switch according to claim 3 wherein the gates of the safety switch transistors are connected together.

6. The power switch according to claim 3 wherein the voltage provided by the power supply that operates to maintain the safety switch OFF back biases the gates of the safety switch transistors relative to the sources of the safety switch transistors to turn OFF both transistors and thereby to turn OFF the safety switch.

7. The power switch according to claim 6 wherein the voltage provided by the power supply provides a first voltage to the safety switch node and a second voltage to the gates of the safety switch transistors.

8. The power switch according to claim 7 wherein the safety switch transistors are n-channel transistors and the first voltage biases the gates of the safety switch transistors negative relative to the sources of the safety switch transistors.

9. The power switch according to claim 7 wherein the safety switch transistors are p-channel transistors and the first voltage biases the gates of the safety switch transistors positive relative to the sources of the safety switch transistors.

10. The power switch according to claim 3 wherein the safety switch transistors are high electron mobility (HEMT) transistors.

11. The power switch according to claim 3 wherein the safety switch transistors are JFETs (Junction Field Effect Transistors).

12. The power switch according to claim 1 wherein the controller comprises a second controller output connected to the gate of the normally OFF transistor at which the controller generates voltage relative to the first ground to turn ON and turn OFF the normally OFF transistor.

13. The power switch according to claim 12 and comprising a DC isolated driver powered at its primary side by the controller power supply that generates the voltage at the second controller output.

\* \* \* \* \*